United States Patent [19]
Abe et al.

[11] Patent Number: 5,266,824
[45] Date of Patent: Nov. 30, 1993

[54] SOI SEMICONDUCTOR SUBSTRATE

[75] Inventors: Takao Abe, Annaka; Yasuaki Nakazato; Atsuo Uchiyama, both of Koshoku, all of Japan

[73] Assignee: Shin-Etsu Handotai Co., Ltd., Tokyo, Japan

[21] Appl. No.: 852,064

[22] Filed: Mar. 16, 1992

[30] Foreign Application Priority Data

Mar. 15, 1991 [JP] Japan .................................. 3-74420

[51] Int. Cl.[5] .................... H01L 27/01; H01L 39/00
[52] U.S. Cl. .................................. 257/347; 257/352; 257/499; 257/506; 437/208; 437/974
[58] Field of Search .................. 357/23.7, 49, 60; 437/208, 974, 925, 939, 946, 966; 257/499, 506, 347, 352

[56] References Cited

U.S. PATENT DOCUMENTS

| | | | |
|---|---|---|---|
| 3,397,278 | 8/1968 | Pomerantz | 357/49 |
| 3,969,753 | 7/1976 | Thorsen, Jr. et al. | 357/60 |
| 4,638,552 | 1/1987 | Shimbo et al. | 437/208 |
| 4,671,846 | 6/1987 | Shimbo et al. | 357/49 |
| 4,897,362 | 1/1990 | Delgado et al. | 357/49 |
| 4,962,062 | 10/1990 | Uchiyama et al. | 437/974 |
| 5,028,558 | 7/1991 | Haisma et al. | 437/974 |

FOREIGN PATENT DOCUMENTS

| | | | |
|---|---|---|---|
| 0417838 | 3/1991 | European Pat. Off. | 437/974 |
| 50-13155 | 5/1975 | Japan | 437/974 |
| 2-94415 | 4/1990 | Japan | 357/23.7 |
| 2-141442 | 5/1990 | Japan | 437/974 |

*Primary Examiner*—Rolf Hille
*Assistant Examiner*—Steven Loke
*Attorney, Agent, or Firm*—Evenson, McKeown, Edwards & Lanahan

[57] ABSTRACT

The present invention provides a semiconductor substrate which is formed by bonding wafers together by heat treatment without causing the substrate to be thermally damaged to have thermal strain, separation, cracks, etc. due to the difference in the thermal expansion coefficient of the wafers, and particularly a semiconductor substrate having an SOI structure which can provide a silicon film thin enough to allow various integrated circuits or TFT-LCD to be formed In the present invention, after wafers are bonded temporarily in a low temperature range, one of the wafers is made thin by chemical treatment, then the wafers were bonded fully by heat treatment in a temperature range (where the thermal expansion coefficient of the wafer are not affected) higher than the above low temperature range, and then said one wafer can be made thinner by mechanical grinding or polishing mechano-chemically. Thus according to the present invention, even if a semiconductor substrate is formed by sticking a silicon wafer and a quartz wafer together, damages that will be caused thermally due to thermal expansion can be prevented and a film which is made thin enough required for forming various integrated circuits or TFT-LCD or the like can be easily obtained.

6 Claims, 1 Drawing Sheet

F I G. 1
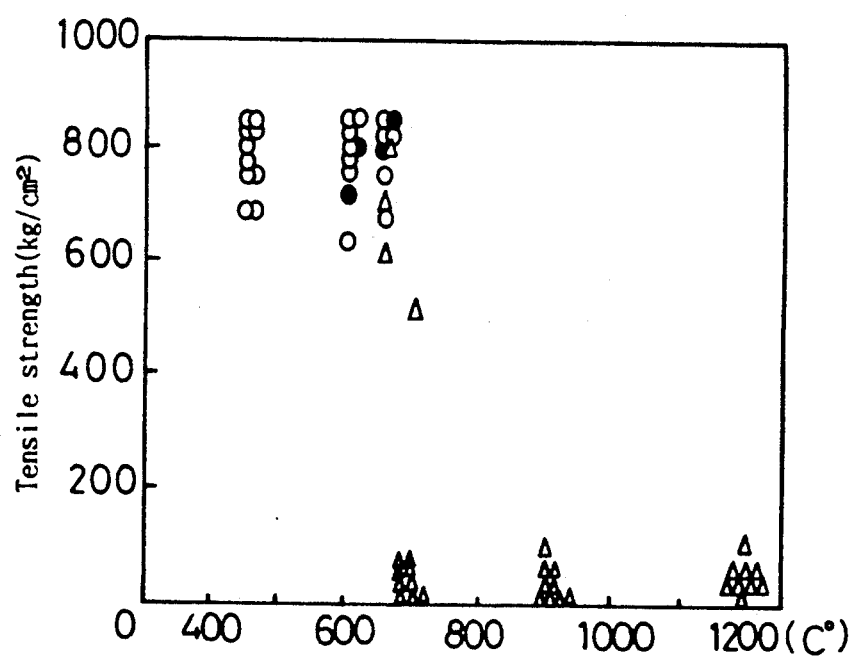

SOI SEMICONDUCTOR SUBSTRATE

BACKGROUND OF THE INVENTION

1. Field of the Invention

The present invention relates to a semiconductor substrate having an SOI structure ($Si/SiO_2$ structure) formed by bonding two wafers integrally, and more particularly to a semiconductor substrate having an SOI structure formed by bonding a silicon wafer and a quartz wafer together and a method of producing said semiconductor substrate having an SOI structure.

2. Prior Art

Semiconductor substrate having an SOI structure formed by bonding two wafers integrally are quite advantageous as base substrates from which highly densified semiconductor integrated circuit devices can be constituted and in recent years they are, for example, used widely as structural substrate for forming liquid crystal devices for HD televisions such as TFT transistors and their peripheral drives and control circuits.

Japanese Patent Application Publication No. 13155/1975 suggests, for example, as a means of producing such semiconductor substrate having an SOI structure, a technique for bonding two wafers firmly together by heating the two wafers at a high temperature (for example about 1,200° C.) under an oxidizing atmosphere with them firmly in contact with each other.

However, in the case wherein a silicon wafer and a quartz wafer are bonded, according to experiments conducted by the present inventors, if the surfaces to be bonded are polished and cleaned, the wafers can be bonded relatively strongly even at a room temperature, but when the surface of the silicon wafer is subjected to mechanical surface grinding by a surface grinder which is a step before the polishing step by abrading, the bonding power between the bonded wafers is still insufficient and further, since the thermal expansion coefficients of them are different (thermal expansion coefficient of silicon: $2.33 \times 10^{-6}$; thermal expansion coefficient of quartz glass: $0.6 \times 10^{-6}$), thermal strain occurs in one of the wafers during heat treatment for temporarily bonding the wafers or during cooling treatment after the full bonding, leading to a risk that a crack, partial separation or the like will develop to damage the wafers.

To obviate such disadvantages, although there are suggested methods wherein two wafers are not stuck as above but an amorphous silicon (a-Si) film is directly formed on a glass substrate corresponding to a quartz wafer by vapor deposition or other means or a polycrystalline silicon film is formed on a glass substrate, for example, by CVD, in the a-Si film and polycrystalline silicon film, the mobility of electrons in the substrate is greatly restricted and therefore the substrate is not satisfactorily suitable for HD televisions and extra-high-frequency and extra-high luminance display devices which will be developed in the future.

That is, when a technique for forming layers by the formation of the above a-Si film is applied for the formation of TFT-LCD (thin-film transistor liquid crystal display) or the like, even though TFT transistors are embedded highly densely, there is a limit to the density of pins to be connected to external drive circuits and therefore to effect the packaging is quite difficult.

On the other hand, when the latter polycrystalline silicon wafer is used instead of the wafer wherein an a.Si film is formed on a glass substrate, the mobility of electrons can be increased in comparison with the case of the a-Si film and since driving circuits can be integrally formed around the TFT region by bonding the polycrystalline silicon wafer onto the quartz glass plate (wafer), it appears that there is no problem of the packaging. However, in the structural substrate for forming a TFT-LCD, it is required to bring the thickness of the silicon layer to an order of 1 μm and it is required that the bonding power between the quartz wafer and the silicon thin film thereon is sufficient because they will be subjected to a thermal or mechanical impact force in the process of the formation of electronic devices, but, at present, the above-mentioned technical problem involved in the difference of thermal expansion coefficient is remained unsolved.

OBJECTS OF THE INVENTION

The present invention has been made taking the above conventional points into consideration and a first object of the present invention is to provide a semiconductor substrate having an SOI structure by bonding two wafers differing in thermal expansion coefficient, i.e., a silicon wafer and a quartz wafer by heat treatment, which semiconductor substrate is free from a risk that the semiconductor substrate is thermally damaged to have, for example, thermal strain, cracks, or partial separation due to the difference in the thermal expansion coefficient of the wafers, and also to provide a method for producing a semiconductor substrate having an SOI structure.

A second object of the present invention is to provide the above-mentioned semiconductor substrate having an SOI structure wherein a thin-film silicon layer can be obtained easily which allows various integrated circuits or TFT-LCD or the like to be well formed and a method for producing such a semiconductor substrate having an SOI structure.

SUMMARY OF THE INVENTION

Generally, when a silicon wafer and a quart wafer whose surfaces are polished and cleaned are brought in contact with each other, they can be stuck and bonded to a certain degree even at a room temperature, but such sticking at about room temperature cannot provide a bonding power sufficient to withstand the surface grinding of the silicon wafer for making it thin as described above and further if the thickness of the wafers is on the order of 500 to 600 μm, high-temperature heat-treatment which is required for obtaining a bonding power which can withstand the surface grinding is impossible for the reason described above.

On the other hand, in such sticking of the silicon wafer and the quartz wafer at about room temperature, since a certain bonding power and air-tight adhesion can be secured, it can be said that the layer of the thus obtained semiconductor substrate can be made thin by etching with a chemical such as an aqueous alkali solution. However, for the purpose of the industrial production, the bonding of wafers is desirably carried out by heat treatment by heating them at a temperature below about 300° C., in that heat treatment temperature range, it is desirable that the silicon wafer which is made rather thin to have a thickness, for example, of about 300 μm and the quartz wafer which is made rather thin to have a thickness, for example, of about 300 μm are temporarily bonded, then the silicon layer is made thin, the temporarily bonded wafers are heat-treated at a prescribed higher temperature to effect full bonding between them to obtain a semiconductor substrate having a sufficient bonding power between the wafers, and thereafter prescribed surface grinding and polishing by abrading are effected, thereby a semiconductor substrate having an SOI structure is obtained wherein a silicon wafer having a sufficiently thinned silicon layer and a quartz wafer are bonded.

Since the semiconductor substrate having an SOI structure obtained by carrying out full bonding is not formed by bonding silicon wafers each having an oxidized film but is formed by bonding a silicon wafer and a quartz wafer whose surfaces are polished by abrading and cleaned, the bonding is considered to be chemical bonding formed at a relatively low temperature due to Si-O-Si bonding caused, for example, by dehydration between the Si-OH's and therefore it seems sufficient that the heat treatment temperature for obtaining thermal and mechanical strength enough to withstand the processing such as the surface grinding and the polishing for the substrate is about 350° C. or over, the maximum temperature of which heat treatment temperature is set by taking the thickness of each of the wafers to be bonded into consideration.

The present invention has been made based on the above finding and, in the present invention, wafers are temporarily bonded together in a relatively low temperature range, then one of the wafers is made thin by chemical treatment, they are heat-treated in a temperature range wherein the temperature is higher than that of the low temperature range and will not affect the thermal expansion coefficient of each of the wafers thereby effecting the full bonding between them, and thereafter the mechanical surface grinding and the mechano-chemically polishing are effected to allow the thinned wafer to be made thinner.

The semiconductor substrate having an SOI structure according to the present invention is a semiconductor substrate formed by bonding two wafers different in thermal expansion coefficient, which semiconductor substrate is produced by heat-treating two wafers, which have been at least abraded and cleaned, in a first temperature range with the surfaces of the wafers to be bonded being pressed to each other thereby forming into a temporarily bonded substrate, subjecting the surface of at least one of the wafers of said temporarily bonded substrate to chemical treatment to make the wafer thin, then heat-treating the substrate in a second temperature range higher than the first temperature range thereby allowing the temporarily bonded substrate to remain as it is or to be made into a fully bonded substrate, then if necessary, after chemically treating or mechanically treating the surface of said one wafer, which has been made thin, to make said one wafer thinner, heat-treating the substrate in a third temperature range higher than said second temperature range is carried out, where steps of making said one wafer further thinner and heat treatments in a further higher temperature range can be repeated, thereby ultimately forming a fully bonded substrate having the wafers bonded together, and obtaining the desirably thinned wafer surface of the fully bonded substrate by abrading.

The semiconductor substrate having an SOI structure according to the present invention is characterized in that the thinning of the surface of one of the wafers of the temporarily bonded substrate is carried out by chemical etching with an aqueous alkali solution.

The semiconductor substrate having an SOI structure according to the present invention is a semiconductor substrate, which semiconductor substrate is obtained by using as wafers different in thermal expansion coefficient a silicon wafer having a prescribed thickness and a quartz wafer having a prescribed thickness, heat-treating the wafers in a first temperature range having a temperature of about 110° to 350° C. with the surfaces of the wafers to be bonded which have at least been ground and cleaned being pressed to each other thereby forming into a temporarily bonded substrate, making at least the silicon wafer surface of said temporarily bonded substrate thin by chemical treatment to cause the surface to have a thickness of about 100 to 200 $\mu$m, heat-treating the temporarily bonded substrate in a second temperature range having a temperature of about 350° to 500° C. which is higher than said first temperature range to form a fully bonded substrate, subjecting the thinned silicon wafer surface of said fully bonded substrate to surface grinding to cause said thinned surface to have a thickness of about 20 $\mu$m, and polishing said further thinned silicon wafer surface by abrading to cause said further thinned silicon wafer surface to have a thickness of about 2 $\mu$m.

The method of producing a semiconductor substrate having an SOI structure according to the present invention is a method of producing a semiconductor substrate formed by bonding two wafters different in thermal expansion coefficient, comprising at least a step of heat-treating two wafers, which have been at least abraded and cleaned, in a first temperature range with the surfaces of the wafers to be bonded being pressed to each other thereby forming into a temporarily bonded substrate, a step of subjecting the surface of at least one of the wafers of said temporarily bonded substrate to chemical treatment to make the wafer thin, a step of heat-treating the substrate in a second temperature range higher than the first temperature range thereby allowing the temporarily bonded substrate to remain as it is or to be made into a fully bonded substrate, if necessary, after a step of chemically treating or mechanically treating the surface of said one wafer, which has been made thin, to make said one wafer thinner, a step of heat-treating the substrate in a third temperature range higher than said second temperature range is carried out, where steps of making said one wafer further thinner and heat treatment in a further higher temperature range are repeated, thereby ultimately forming a fully bonded substrate having the wafers bonded together, and a step of polishing advanced by abrading the thinned wafer surface of said fully bonded substrate makes said particular wafer thinner.

The method of producing a semiconductor substrate having an SOI structure according to the present invention is characterized in that the thinning of the surface of one of the wafers of the temporarily bonded substrate is carried out by chemical etching with an aqueous alkali solution.

The method of producing a semiconductor substrate having an SOI structure according to the present invention is a method wherein use is made of as wafers different in thermal expansion coefficient a silicon wafer having a prescribed thickness and a quartz wafer having a prescribed thickness and which comprises a step of heat-treating the wafers in a first temperature range having a temperature of about 110° to 350° C. with the surfaces of the wafers to be bonded which have at least been ground and cleaned being pressed to each other thereby forming into a temporarily bonded substrate, a step of making at least the silicon wafer surface of said temporarily bonded substrate thin by chemical treatment to cause the surface to have a thickness of about 100 to 200 μm and heat-treating the temporarily bonded substrate in a second temperature range having a temperature of about 350° to 500° C. to form a fully bonded substrate, and a step of subjecting the thinned silicon wafer surface of said fully bonded substrate to surface grinding to cause said thinned surface to have a thickness of about 20 μm, and polishing said further thinned silicon wafer surface by abrading to cause said further thinned silicon wafer surface to have a thickness of about 2 μm.

BRIEF DESCRIPTION OF THE DRAWINGS

FIG. 1 is a graph showing the relationship between the heat treatment temperature and the bonding strength between wafers in the process of forming a semiconductor substrate having an SOI structure according to the present invention.

DETAILED DESCRIPTION OF THE INVENTION

Now, the semiconductor substrate having an SOI structure according to the present invention and the method of producing the same will be described with reference to an example in detail in the order of the steps.

It is, however, not intended to limit the scope of the present invention within the experiment conditions, the dimensions and materials of samples, etc. in the example, but it is merely aimed to an illustrative purpose, unless otherwise specified.

In this example, as a base wafer a quartz glass plate (wafer) circular in shape and having a diameter of 100 mm and a thickness of 550 μm was polished by abrading and the surface to be bonded was cleaned by carrying out a primary cleaning and a secondary cleaning.

As a bond wafer a silicon wafer circular in shape and having a diameter of 100 mm and a thickness of 550 μm is made thin by mechanical surface grinding so that the wafer might have a thickness of 300 μm, then the surface was finished by mechano-chemical polishing so that the surface roughness might be in the order of about 5 nm in terms of the difference of the levels and the thickness might be brought to 285 μm, and the surface to be bonded was cleaned by carrying out a primary cleaning and a secondary cleaning. In the cleaning, particularly in the secondary cleaning, if the cleaning means is different from that for the base wafer, there is a fear that the subsequent bonding will not be smoothly carried out because the surface states of the wafers becomes different. Thus, in this example, the final secondary cleaning was effected with a cleaning liquid of $HCl/H_2O_2$.

The wafers with them being pressed together were loaded in a thermostatic chamber and were heat-treated by keeping the temperature therein at about 100° to 350° C. for one hour or over, more specifically by keeping the temperature constant at 300° C. for 2 hours, thereby bonding the wafers temporarily.

The silicon wafer surface of the thus obtained temporarily bonded substrate was etched with an aqueous alkali solution so the thickness of the silicon wafer might be reduced from 285 μm to 135 μm and then was washed to remove completely the alkali used in the etching.

When the temporarily bonded substrate whose silicon wafer surface had been thinned was heat-treated at a temperature of 450° C. in a gas atmosphere to bond the wafers fully, the bonding force between the wafers was high enough to allow the substrate to be subjected to surface grinding to make the substrate thin as desired and a prescribed bonding strength was obtained. The bonding strength was about 800 kg/cm$^2$ on the average.

The silicon wafer of the substrate which was obtained by bonding fully the wafers by heat-treatment at 450° C. was subjected to surface grinding to reduce the thickness from 125 μm to 20 μm and when the substrate was heat-treated by heating it at 700° C. for 2 hours, it was found that the bonding strength lowered extremely. As described above, this will be attributed to occurrence of cracks or partial separation at the bonded boundary between the silicon wafer and the quartz wafer.

In the graph shown in FIG. 1, the values shown near 450° C. indicate the bonding strength after the heat treatment at 450° C. and the values shown over 600° C. indicate the bonding strength at the time when the substrate was heat-treated at 450° C., the thickness of the silicon wafer was reduced to 20 μm by mechanical surface grinding, and then the substrate was heat-treated at the temperatures shown in the graph. Herein, 10 samples of wafers were measured in each case and the measured values were plotted directly. In the graph, the hollow circles indicate good bonding, the solid circles indicate imperfect bonding, and the hollow triangles indicate substrates with defects.

Then, the silicon wafer of the substrate obtained by fully bonding the wafers by heat-treating by heating at 450° C. was subjected to mechanical surface grinding to reduce the thickness from 135 μm to 20 μm, the periphery thereof was etched selectively to remove the peripheral chip to make it approximately round, the silicon wafer was polished by abrading to reduce the thickness thereof from 20 μm to 2 μm. Thus it was confirmed that substantially a thin silicon film can be formed which is required to form thereon various integrated circuits or TFT-LCD or the like.

Although bonding between a silicon wafer and a quartz glass plate is described in the above example, the above technique can be applied naturally to bonding between wafers different in thermal expansion coefficient for the same purpose. It is a useful means that after the temporary bonding, thinning of the wafer and heat treatment in a higher temperature range are repeated.

Thus as described with reference to an example above, according to the present invention, even if wafers different in thermal expansion coefficient are bonded to form a semiconductor substrate, a risk that the semiconductor substrate will be thermally damaged due to the difference of the thermal expansion coefficient can be eliminated completely and a silicon layer which is made thin enough as prescribed can be formed easily and favorably, which is an excellent feature of the present invention.

What is claimed is:

1. A semiconductor substrate comprising a quartz wafer and a second wafer of material other than quartz having a predetermined initial thickness, said quartz wafer and said second wafer having different thermal expansion coefficients, said quartz wafer and said second wafer having polished and cleaned surfaces temporarily bonded to each other by pressing against each other and heating in a first temperature range, said second wafer being reduced in thickness by chemical treatment to a thickness less than said predetermined initial thickness and thereafter more strongly bonded to said quartz wafer without thermal damage due to the differing thermal expansion coefficients by heating in a second temperature range higher than said first temperature range to effect bonding sufficient to withstand grinding stresses, and said second wafer having a mechano-chemically polished exposed surface formed thereon.

2. A semiconductor substrate according to claim 1, wherein said substrate is produced by a process further comprising subjecting said second wafer, after it is more strongly bonded to said quartz wafer, to chemical or mechanical treatment to further reduce the thickness of said second wafer, and heat treating said substrate in a third temperature range higher than said second temperature range prior to forming said mechano-chemically polished exposed surface on said second wafer.

3. A semiconductor substrate according to claim 1, wherein said chemical treatment to reduce the thickness of said second wafer is effected by etching with an aqueous alkali solution.

4. A semiconductor substrate according to claim 1, wherein said second wafer is a silicon wafer.

5. A semiconductor substrate according to claim 1, wherein said second wafer has an initial thickness in the range from 500 to 600 $\mu$m, said chemical treatment reduces the thickness of said second wafer to a thickness in the range from 100 to 200 $\mu$m, and after heating in said second temperature range, said second wafer is ground to a thickness of about 20 $\mu$m and polished to a final thickness of about 2 $\mu$m.

6. A semiconductor substrate according to claim 1, wherein said first temperature range is from about 110° to 350° C., and said second temperature range is from about 350° to 500° C.

* * * * *